(12) United States Patent
Lee et al.

(10) Patent No.: US 9,583,373 B2
(45) Date of Patent: Feb. 28, 2017

(54) WAFER CARRIER HAVING CAVITY

(71) Applicant: Samsung Electronics Co., Ltd., Suwon-si (KR)

(72) Inventors: Ho-Jin Lee, Seoul (KR); Pil-kyu Kang, Anyang-si (KR); Taeyeong Kim, Suwon-si (KR); Byung Lyul Park, Seoul (KR); Kyu-Ha Lee, Yongin-si (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 589 days.

(21) Appl. No.: 13/964,433

(22) Filed: Aug. 12, 2013

(65) Prior Publication Data

US 2014/0110894 A1    Apr. 24, 2014

(30) Foreign Application Priority Data

Oct. 22, 2012 (KR) ........................ 10-2012-0117360

(51) Int. Cl.
*H01L 21/683* (2006.01)
*H01L 23/00* (2006.01)

(52) U.S. Cl.
CPC ........... *H01L 21/6835* (2013.01); *H01L 24/92* (2013.01); *H01L 24/03* (2013.01); *H01L 24/13* (2013.01); *H01L 24/16* (2013.01); *H01L 24/17* (2013.01); *H01L 24/94* (2013.01); *H01L 2221/6834* (2013.01); *H01L 2221/68318* (2013.01); *H01L 2221/68327* (2013.01); *H01L 2224/0401* (2013.01); *H01L 2224/131* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01); *H01L 2224/92* (2013.01); *H01L 2224/9222* (2013.01); *H01L 2224/92222* (2013.01); *H01L 2224/94* (2013.01); *H01L 2225/06513* (2013.01); *H01L 2225/06517* (2013.01); *H01L 2225/06541* (2013.01);

(Continued)

(58) Field of Classification Search
None
See application file for complete search history.

(56) References Cited

U.S. PATENT DOCUMENTS 5,396,402 A * 3/1995 Perugini ............. H01L 23/4093
                                                                257/718
5,645,164 A * 7/1997 Hocking ................. B44D 3/126
                                                                206/15.3

(Continued)

FOREIGN PATENT DOCUMENTS

JP     05-335292      12/1993
JP     2005-116948     4/2005

(Continued)

*Primary Examiner* — Joseph J Hail
*Assistant Examiner* — Brian Keller
(74) *Attorney, Agent, or Firm* — Myers Bigel, P.A.

(57) ABSTRACT

A wafer carrier includes a base having a cavity provided at the center of the base and an outer sidewall extending along and away from an edge of the base to define the cavity. The cavity is configured to be filled with an adhesive layer. The wafer carrier is configured to be bonded to a wafer with an adhesive layer in the cavity of base such that the outer sidewall faces and is in contact with an edge of the wafer and the cavity faces a center of the wafer.

13 Claims, 12 Drawing Sheets

(52) U.S. Cl.
CPC ............... *H01L 2225/06565* (2013.01); *H01L 2924/15311* (2013.01)

(56) References Cited

U.S. PATENT DOCUMENTS

| | | | | |
|---|---|---|---|---|
| 6,140,571 | A * | 10/2000 | Kitahara | G03F 7/70433 165/185 |
| 6,504,243 | B1 * | 1/2003 | Andric | H01L 23/4093 257/706 |
| 7,543,718 | B2 * | 6/2009 | Simon | A61J 7/0084 206/380 |
| 8,247,895 | B2 | 8/2012 | Haensch et al. | |
| 2007/0068454 | A1 * | 3/2007 | Saeki | H01L 21/6838 118/715 |
| 2008/0230913 | A1 | 9/2008 | Huang et al. | |
| 2009/0032928 | A1 | 2/2009 | Chiang et al. | |
| 2010/0194014 | A1 | 8/2010 | Huang et al. | |
| 2011/0227226 | A1 | 9/2011 | Chiang et al. | |
| 2012/0322231 | A1 * | 12/2012 | Kim | H01L 21/561 438/460 |

FOREIGN PATENT DOCUMENTS

| | | |
|---|---|---|
| JP | 2007-083377 | 4/2007 |
| JP | 2008-258303 | 10/2008 |
| JP | 2009-188254 | 8/2009 |
| JP | 2011-023659 | 2/2011 |
| JP | 2011-228565 | 11/2011 |

\* cited by examiner

WAFER CARRIER HAVING CAVITY

CROSS-REFERENCE TO RELATED APPLICATIONS

This U.S. non-provisional patent application claims priority under 35 U.S.C. §119 to Korean Patent Application No. 10-2012-0117360, filed on Oct. 22, 2012, in the Korean Intellectual Property Office, the entire contents of which are hereby incorporated by reference.

FIELD

Embodiments of the inventive concept relate to a wafer carrier and more particularly, to a wafer carrier having a cavity to be filled with an adhesive layer.

BACKGROUND

According to the conventional process of fabricating a semiconductor device, to perform a process of thinning a wafer (e.g., a back lap process), a carrier is attached to the wafer using an adhesive material. If a thickness of the adhesive or a distance between the wafer and the carrier is not uniform, the wafer may be polished to have a non-uniform thickness, during the back lap process. In this case, when through silicon vias are formed through the wafer, protruding lengths of the through silicon vias may vary from position to position, and thus, the through silicon vias may be broken.

SUMMARY

According to some embodiments of the inventive concepts, a wafer carrier includes a base having a cavity provided at a center of the base and an outer sidewall extending along and away from an edge of the base to define the cavity. The cavity is configured to be filled with an adhesive layer. The wafer carrier is configured to be bonded to a wafer with an adhesive layer in the cavity of the base such that the outer sidewall faces and is in contact with an edge of a wafer and the cavity faces a center of the wafer.

In some embodiments, the outer sidewall may include at least one outer groove that may be formed on the edge of the base. The at least one outer groove may provide an open path from the cavity to outside of the wafer carrier when the wafer carrier is bonded to the wafer.

In some embodiments, the wafer carrier may further include an inner pattern provided in the cavity and extending outwardly from the base.

In some embodiments, the inner pattern may include at least one inner wall, and the pattern that be shaped like a grid or ring.

In some embodiments, the at least one inner wall may divide the cavity into a plurality of inner regions.

In some embodiments, the at least one inner wall may include at least one inner groove that provides an open path between the plurality of inner regions.

In some embodiments, the inner pattern may include a plurality of island-shaped or point-like projections that may be regularly or irregularly arranged in the cavity.

In some embodiments, the inner pattern may have a height that may be substantially equivalent to or smaller than that of the outer sidewall.

In some embodiments, the wafer carrier may further include an insulating coating layer covering an inner surface of the cavity.

In example embodiments, the outer sidewall may have an inner side surface that may be perpendicular or at an angle to a top surface of the base from which the outer sidewall extends.

According to some other embodiments of the inventive concepts, a wafer carrier configured to be bonded to a wafer by an adhesive layer includes a cavity and an outer dam extending along an outer boundary of the cavity. The cavity is configured to be filled with the adhesive layer and is configured to face a center of the wafer when the wafer carrier is bonded to the wafer. The outer dam includes at least one outer groove. The outer dam is configured to face and contact an edge of the wafer such that the at least one outer groove provides an open path from the cavity to outside the wafer carrier when the wafer carrier is bonded to the wafer.

In some embodiments, the wafer carrier may further include an inner dam provided in the cavity to have a height that may be substantially equivalent to or smaller than that of the outer dam. The inner dam may include a pattern of island-shaped or point-like projections.

In some embodiments, the wafer carrier may further include an inner dam dividing the cavity into a plurality of inner regions.

In some embodiments, the inner dam may include at least one continuous inner wall isolating the plurality of the inner regions from each other.

In some embodiments, the inner dam may include at least one inner wall having an inner groove defined therein connecting the plurality of the inner regions to each other.

In some embodiments, the inner dam may have a height that may be substantially equivalent to or smaller than that of the outer dam.

The at least one outer groove may be configured to release adhesive from the adhesive layer when the wafer carrier is bonded to the wafer.

According to some other embodiments of the inventive concepts, a wafer carrier includes a body including a base and an outer wall extending outwardly away from an edge of the base, with the outer wall defining a cavity in the body, and with the outer wall including a plurality of gaps. The wafer carrier is configured to be bonded to a wafer by an adhesive layer filling the cavity such that, when the wafer carrier is bonded to the wafer, the outer wall of the wafer carrier contacts the wafer and the gaps of the outer wall define a flow path for adhesive from the adhesive layer to flow from the cavity to outside the wafer carrier.

The wafer carrier body may be circular, and the body may include a circular inner wall extending outwardly away from the base and disposed in the cavity. The inner wall may have a height that is substantially equal to or less than a height of the outer wall.

The wafer carrier body may include a plurality of inner walls extending outwardly from the base and disposed in the cavity, with the inner walls forming a grid-shaped pattern. Each of the inner walls may have a height that is substantially equal to or less than a height of the outer wall.

The wafer body may include a plurality of projections extending outwardly from the base and disposed in the cavity. Each projection may have a height that is substantially equal to or less than a height of the outer wall.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
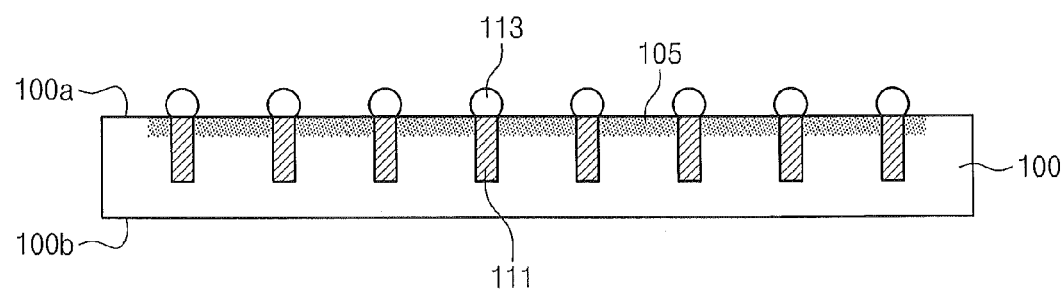
FIGS. 1A through 1J are sectional views illustrating a method of fabricating a semiconductor device using a wafer carrier according to some embodiments of the inventive concept.

It should be noted that the figures are intended to illustrate the general characteristics of methods, structure and/or materials utilized in certain example embodiments and to supplement the written description provided herein. These drawings may not be, however, to scale and may not precisely reflect the precise structural or performance characteristics of any given embodiment, and should not be interpreted as defining or limiting the range of values or properties encompassed by example embodiments.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1J are sectional views illustrating a method of fabricating a semiconductor device using a wafer carrier according to example embodiments of the inventive concept. FIGS. 1K and 1L are sectional views illustrating a back-lapping process using a carrier different from those shown in FIGS. 1A through 1J.

Referring to FIG. 1A, a wafer 100 may be provided. The wafer 100 may include silicon. The wafer 100 may include a first or top surface 100a provided with an integrated circuit 105 and a second or bottom surface 100b opposite the first or top surface 100a. The integrated circuit 105 may include memory elements, logic circuits, or any combination thereof. The wafer 100 may include a plurality of through electrodes 111 extending along a thickness direction of the wafer 100 but not penetrating the wafer 100. The through electrodes 111 may be electrically connected to the integrated circuit 105. A plurality of connection terminals 113 (e.g., solder balls) may be provided on the top surface 100a of the wafer 100. The connection terminals 113 may be electrically connected to the through electrodes 111, respectively.

Figure 1B:
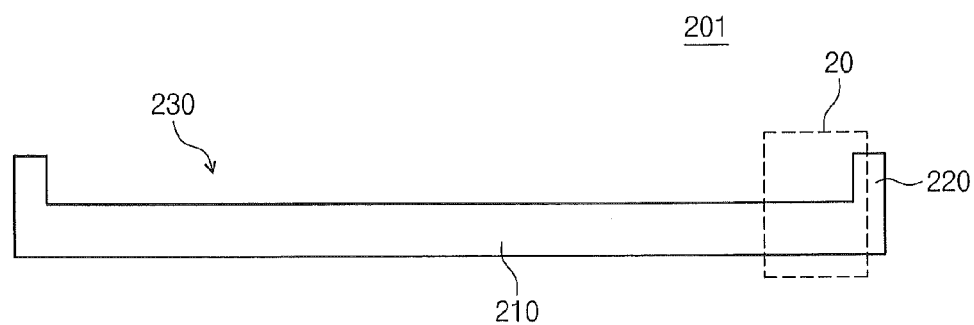

Referring to FIG. 1B, a carrier 201 may be provided. The carrier 201 may be bonded to the first or top surface 100a of the wafer 100 to support the wafer 100 during a back lap process. The carrier 201 may include a cavity 230 having a recessed structure. The cavity 230 may be formed using a dry or wet etching process, in which an oxide layer or a nitride layer is used as an etch mask. In other embodiments, an etching apparatus provided with a bottom shadow ring (hereinafter, BSR) may be used to form the cavity 230 of the carrier 201. The BSR may be disposed to cover an edge of the carrier 201 and prevent etching gas from being supplied to the edge of the carrier 201. In this case, the BSR may serve as an etch mask, and thus, the cavity 230 can be formed without using an etch mask.

The carrier 201 may include a base 210, whose size and shape may be identical or similar to those of the wafer 100, and an outer dam 220 extending vertically and/or away from an edge of the base 210. The outer dam 220 may also be referred to herein as an outer sidewall or an outer wall. The shape of the carrier 201 will be described in more detail with reference to FIGS. 2A through 2H.

The carrier 201 may be transparent or opaque. For example, the carrier 201 may include a transparent substrate (e.g., glass or polycarbonate). Alternatively, the carrier 201 may include an opaque substrate (e.g., of metal or silicon). Materials for the carrier 201 may not be limited to the afore-described materials. In other words, any material can be used for the carrier 201, if it can support the wafer 100 robustly.

Figure 1C:
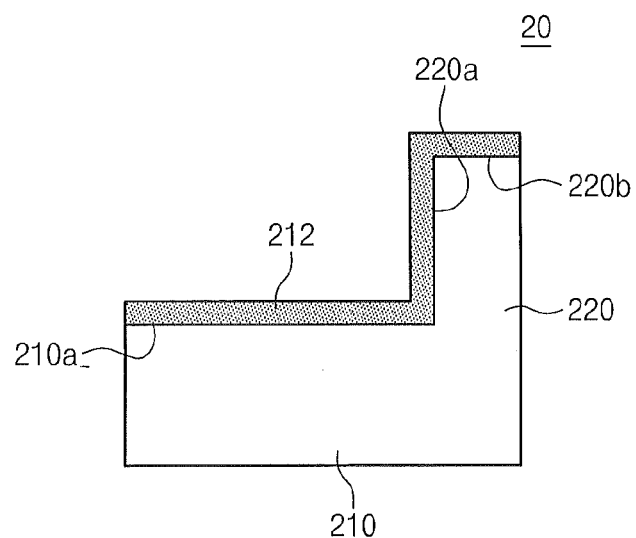
Figure 1D:
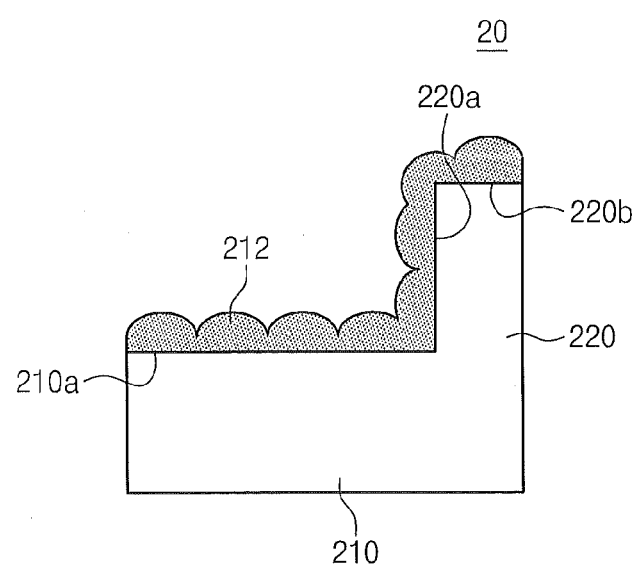

A surface treatment process may be performed on an inner surface of the cavity 230. For example, as illustrated in FIG. 1C which is a portion 20 of FIG. 1B, an insulating coating layer 212, such as an oxide layer (e.g., SiOx), a nitride layer (e.g., SiNx), or a polymer layer may be formed on a first, top or upper surface 210a of the base 210 and an inner side surface 220a of the outer dam 220. In addition, the coating layer 212 may also be formed on a top or upper surface 220b of the outer dam 220. The coating layer 212 may have a substantially flat surface in a local region. In other embodiments, the coating layer 212 may have an uneven surface, as shown in FIG. 1D. The coating layer 212 may be formed to cover a portion of an outer surface of the carrier 201 (e.g., the inner surface of the cavity 230) or the whole outer surface of the carrier 201, as described above. Even though an adhesive layer (see 300 of FIG. 1E) will be provided to fill the cavity 230, the use of the coating layer 212 may facilitate a process of detaching the carrier 201.

Figure 1E:
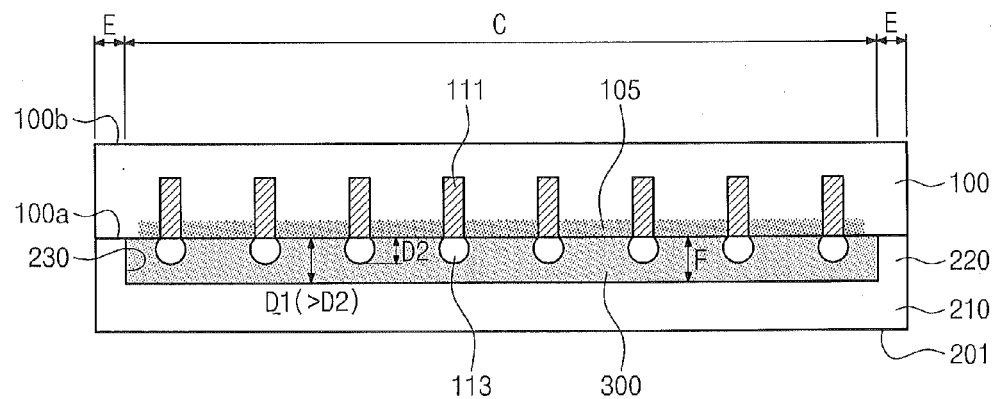

Referring to FIG. 1E, an adhesive layer 300 may be formed in the cavity 230 to bond the wafer 100 to the carrier 201. The adhesive layer 300 may include epoxy, polyvinyl acetate, polyvinyl alcohol, polyvinyl acrylate, silicon resin, epoxy acrylate, urethane acrylate, polyester acrylate, silicon acrylate, vinyl ether, and so forth. The adhesive layer 300 may be formed, for example, by a chemical vapor deposition (CVD) process, a spray coating process, or a spin coating process. In other embodiments, the adhesive layer 300 may be formed using a film lamination process. According to some embodiments of the inventive concept, the carrier 201 may be formed to have a size or shape (e.g., width and depth) identical or similar to the wafer 100, and the wafer 100 may be bonded to the carrier 201 in such a way that the top surface 100a thereof faces the cavity 230. Accordingly, the outer dam 220 of the carrier 201 may face an edge E of the wafer 100, and the cavity 230 of the carrier 201 may face a center C of the wafer 100. The center C of the wafer 100 may be a region where at least one chip including the integrated circuit 105 and the through electrode 111 is provided, and the edge E of the wafer 100 may be a region surrounding the center C of the wafer 100.

As the result of the bonding between the wafer 100 and the carrier 201, structures (e.g., the connection terminals 113) on the top surface 100a of the wafer 100 may be provided in the cavity 230. In this case, in order to relieve damage on the connection terminals 113 and/or robustly support the wafer 100, a depth D1 of the cavity 230 may be greater than a protruding length D2 of the structures (e.g., the connection terminals 113) on the top surface 100a of the wafer 100.

In the illustrated embodiment, the wafer 100 may be bonded to the carrier 201 in the state that the adhesive layer 300 is provided in the cavity 230 and the outer dam 220 of the carrier 201 is in contact with the edge E of the wafer 100. The adhesive layer 300 may have a thickness F that is equivalent or substantially similar to the depth D1 of the cavity 230. If the thickness F of the adhesive layer 300 has a variation, the wafer 100 may be bonded to the carrier 201 in a sloping fashion (e.g., with the wafer 100 angled with respect to the carrier 201). In the illustrated embodiment, the thickness F of the adhesive layer 300 is uniform or substantially uniform. Accordingly, it is possible to prevent the wafer 100 from being slantingly bonded to the carrier 201. In other words, a potential gap between the carrier 201 and the wafer 100 may be removed or reduced. Even if the adhesive layer 300 is excessively supplied and overflows from the cavity 230, a surplus portion of the adhesive layer 300 may flow through outer grooves 225, as will be described with reference to FIG. 2A. Accordingly, it is possible to maintain the thickness F of the adhesive layer 300 uniformly and to remove or reduce gap(s) between the wafer 100 and the carrier 201.

Figure 1F:
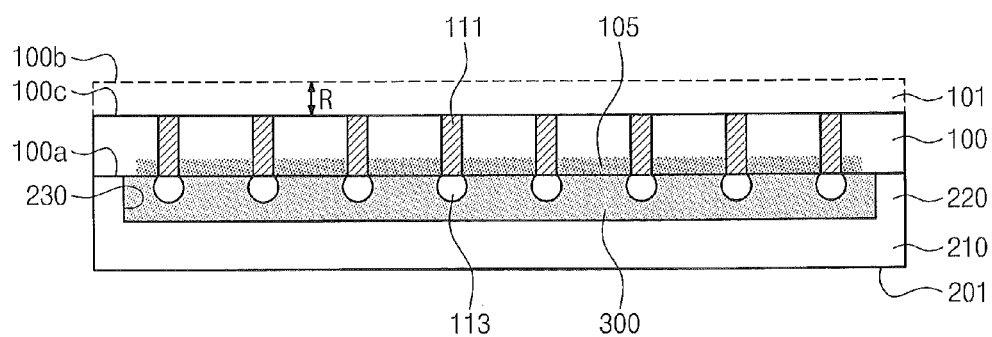
Figure 1G:
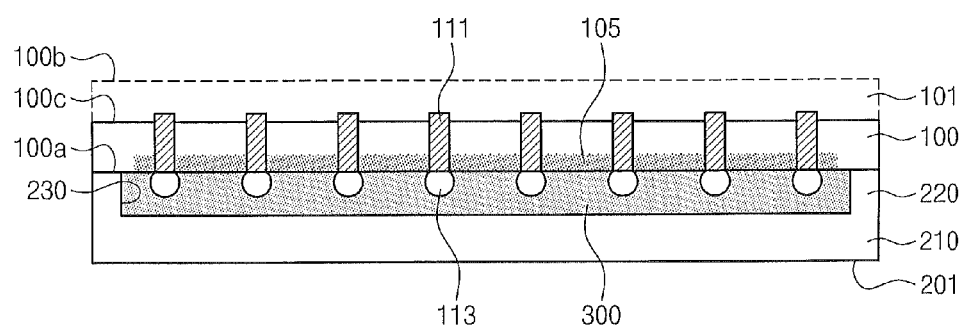

Referring to FIGS. 1F and 1G, a back lap process may be performed to expose or project the through electrodes 111. For example, in a state that the wafer 100 is supported by the carrier 201, the second or bottom surface 100b of the wafer 100 may be recessed using, for example, a chemical-mechanical polishing process, a wet etching process, a dry etching process, a spin etching process, or a grinding process. Since the carrier 201 supports the wafer 100, it is possible to prevent the wafer 100 from being bent or broken during the recess process. The recess process may be performed to expose the through electrodes 111 as shown in FIG. 1F or to project the through electrodes 111 as shown in FIG. 1G, thereby defining a second bottom or recessed second surface 100c of the wafer 100. In the present specification, the second bottom surface 100c of the wafer 100 may be referred to as a "non-active surface", while the top surface 100a may be referred to as an "active surface". In the illustrated embodiment, since the wafer 100 is not slanted relative to the carrier 201 during the back lap process, it is possible to remove or decrease a spatial variation in height R of a region 101 to be removed from the wafer 100.

Alternatively, as shown in FIG. 1K, if a carrier 201a does not have a cavity, a thickness F of the adhesive layer 300 may vary from position to position. Accordingly, the wafer 100 may be bonded to the carrier 201a at an angle, and this may lead to a positional variation in height R of the region 101, which will be removed from the wafer 100 in the back lap process, and a positional variation in final thickness of the wafer 100. Further, as shown in FIG. 1L, the bottom surface 100b of the wafer 100 may be etched in the state that the wafer 100 is bonded to the carrier 201a at an angle, such that some of the through electrodes 111 may not be exposed and/or protruding lengths of the through electrodes 111 may be non-uniform. In the case where the through electrodes 111 have non-uniform protruding length, some of the through electrodes 111 may be broken during, for example, the grinding process, and a process yield may decrease.

According to the embodiments of the inventive concept, and as shown in FIG. 1F or 1G, the wafer 100 and the carrier 201 may be bonded parallel to each other and the wafer 100 may be uniformly recessed, and thus, it is possible to prevent or reduce process failures such as non-exposure or breakage of the through electrodes 111. After the back lap process, the wafer 100 may be separated from the carrier 201. The carrier 201 may be recycled.

Figure 1H:
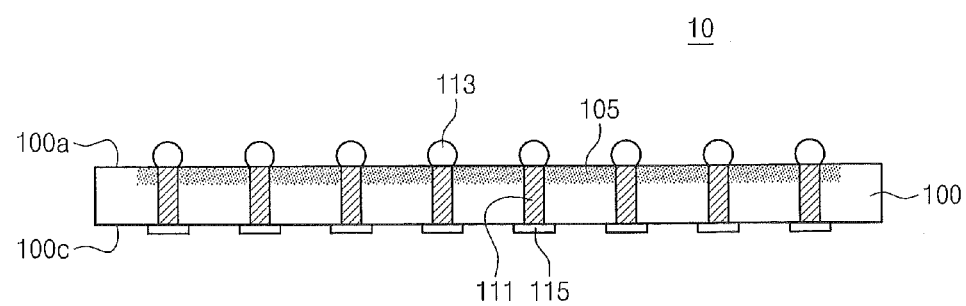
Figure 1I:
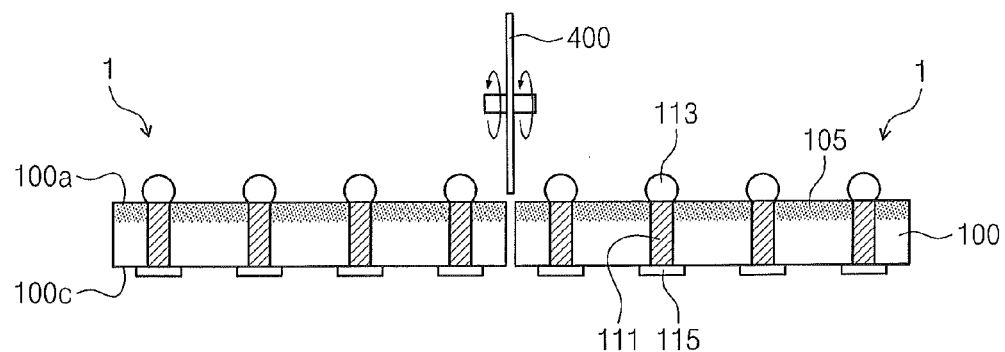

Referring to FIG. 1H, after the back lap process, a post-FAB process may be further performed to form pads 115, which may be provided on the second bottom surface 100c of the wafer 100 and coupled to the through electrodes 111. A wafer-level semiconductor device 10 provided with one or more chips may be fabricated through a series of subsequent steps.

Referring to FIG. 11, a wafer dicing process may be performed. For example, a cutting wheel 400 may be used to cut the wafer 100 along scribe lanes and form a plurality of chips separated from each other. Accordingly, a plurality of chip-level semiconductor devices 1 may be fabricated.

Figure 1J:
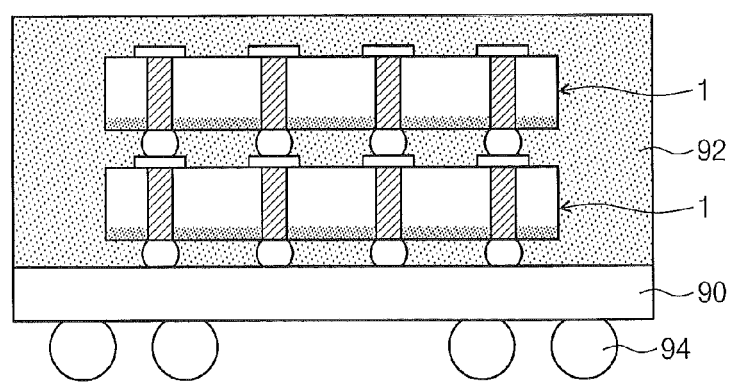
Figure 1K:
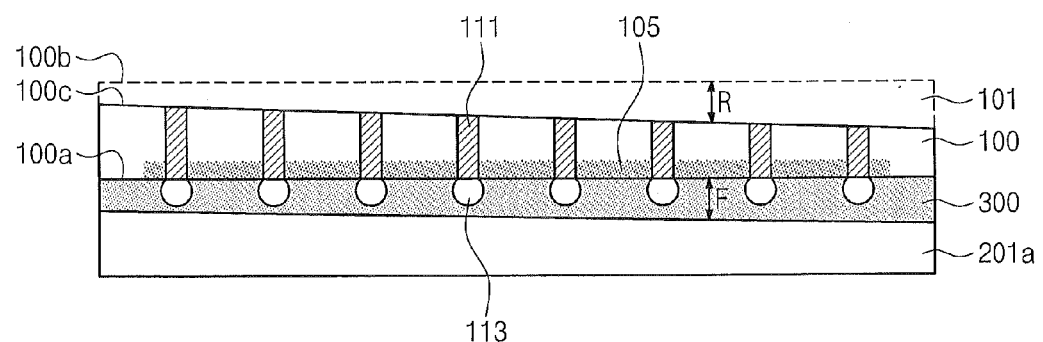
FIGS. 1K and 1L are sectional views illustrating a back-lapping process using a carrier different than those illustrated in FIGS. 1A through 1J.
Figure 1L:
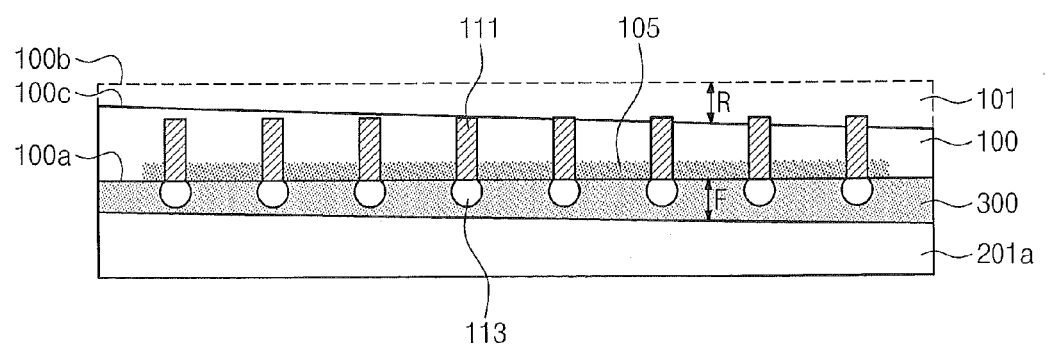

Referring to FIG. 1J, one or more semiconductor devices 1 may be mounted on a printed circuit board 90 to form a semiconductor package 2. The semiconductor package 2 may include a mold layer 92 encapsulating the one or more semiconductor devices 1 and outer terminals 94 (e.g., solder balls) connecting the semiconductor package 2 electrically to an external device.

Figure 2A:
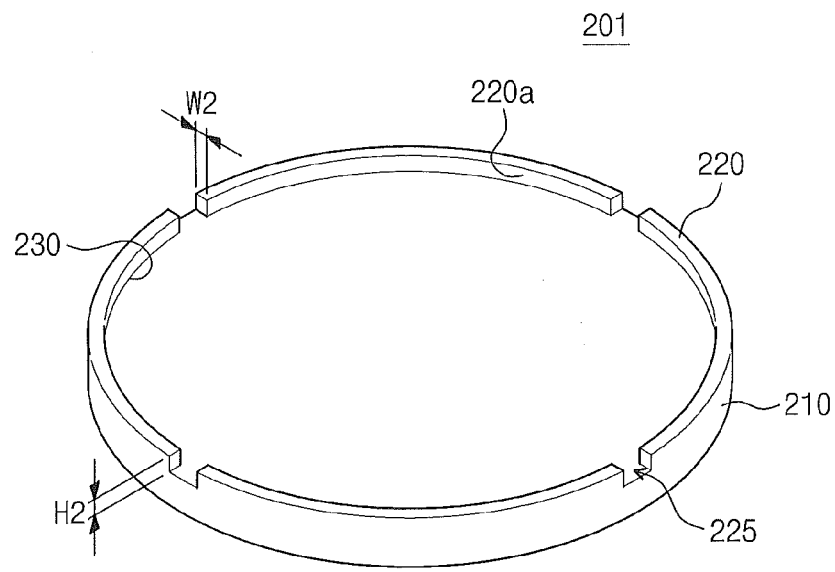
FIG. 2A is a perspective view illustrating a wafer carrier according to some embodiments of the inventive concept.

FIG. 2A is a perspective view illustrating a wafer carrier according to example embodiments of the inventive concept. FIGS. 2B through 2H are perspective views of wafer carriers according to modifications of the example embodiments of the inventive concept shown in FIG. 2A.

Referring to FIG. 2A in conjunction with FIG. 1E, the carrier 201 may include the base 210, which have a shape (e.g., resembling a circular disk) that is equivalent or substantially similar to that of the wafer 100, and the outer dam, sidewall or wall 220 (e.g., having a ring shape) vertically extending away from the edge of the base 210 to define or delimit the cavity 230. The outer dam 220 may be discontinuously provided along the edge or an outer periphery of the base 210. The inner side surface 220a of the outer dam 220 may be perpendicular or substantially perpendicular to the top surface of the base 210.

The carrier 201 may include at least one outer gap or groove 225 that is provided along the edge of the base 210. More than one outer gap or groove 225 may be provided spaced apart from each other in a regular or irregular space. That is, the gaps or grooves 225 may or may not be equally spaced-apart from one another. The adhesive layer 300 (FIG. 1E) may be provided to overflow the cavity 230. In this case, when the carrier 201 is bonded to the wafer 100, the adhesive layer 300 may be compressed or pressured such that a surplus portion of the adhesive layer 300 may be exhausted through the outer groove 225. Since the adhesive layer 300 can be squeezed out through the outer groove 225, it is possible to remove or reduce a gap between the carrier 201 and the wafer 100, and consequently, to prevent the wafer 100 from being bonded to the carrier 201 at an angle. In addition, since the adhesive layer 300 can be squeezed out through the outer groove 225, it is possible to prevent or reduce the likelihood of the side surface of the wafer 100 and/or carrier 201 from being polluted by the adhesive layer 300.

When the wafer 100 and the carrier 201 are bonded to each other, it is desirable to prevent the top surface 100a of the wafer 100 or a structure provided thereon (e.g., the connection terminals 113) from being damaged. In this sense, the adhesive layer 300 may be formed to have the thickness F greater than the protruding lengths D2 of the connection terminals 113. The thickness F of the adhesive layer 300 may be dependent on the depth D1 of the cavity 230, and the depth D1 of the cavity 230 may be dependent on a height H2 of the outer dam 220. In this sense, the outer dam 220 may be formed to have the height H2 that is greater than the protruding lengths D2 of the connection terminals 113. The outer dam 220 may be in contact with the edge E of the wafer 100. Accordingly, the outer dam 220 may have a width W2 that is equivalent to or smaller than that of the edge E of the wafer 100.

Figure 2B:
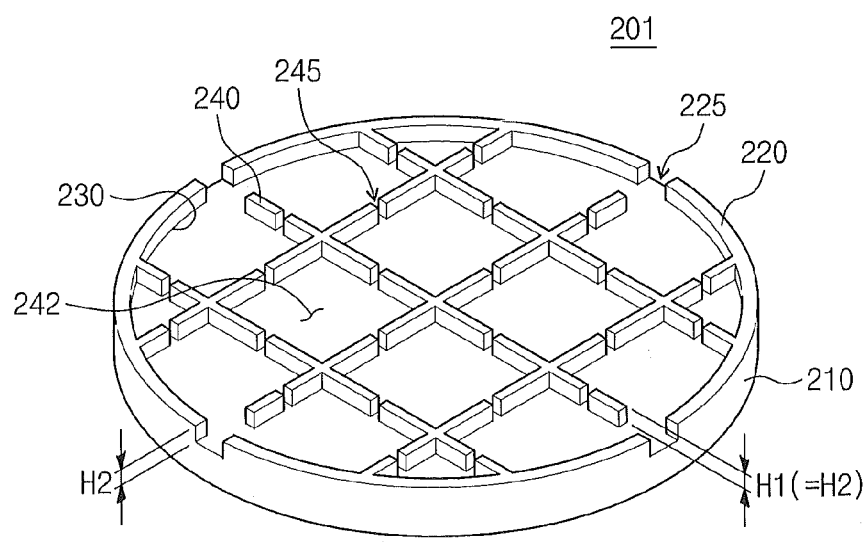
FIGS. 2B through 2H are perspective views of wafer carriers according to some other embodiments of the inventive concept.

Referring to FIG. 2B, the carrier 201 may further include an inner dam 240 dividing the cavity 230 into a plurality of inner regions 242. The inner dam 240 may be or include a plurality of inner walls crossing each other on the base 210, thereby forming a grid-shaped or mesh-shaped pattern or structure. The inner dam 240 may extend discontinuously and define inner gaps or grooves 245 spatially connecting the inner regions 242 to each other. The inner grooves 245 may be provided spaced apart from each other with a regular or irregular space. That is, the inner gaps or grooves 245 may or may not be equally spaced-apart from each other. As shown in FIG. 1E, when the wafer 100 and a carrier 201 are bonded to each other, the adhesive layer 300 can flow (e.g., flow smoothly) through the inner grooves 245, and thus, it is possible to improve uniformity in the thickness of the adhesive layer 300 or to squeeze out the adhesive layer 300 effectively. A height H1 of the inner dam 240 may be equivalent or similar to the height H2 of the outer dam 220. The inner dam 240 may be formed to align with, correspond to, or vertically overlap with the scribe lane of the wafer 100. Accordingly, each of the inner regions 242 may correspond to one or more chip area(s).

Figure 2C:
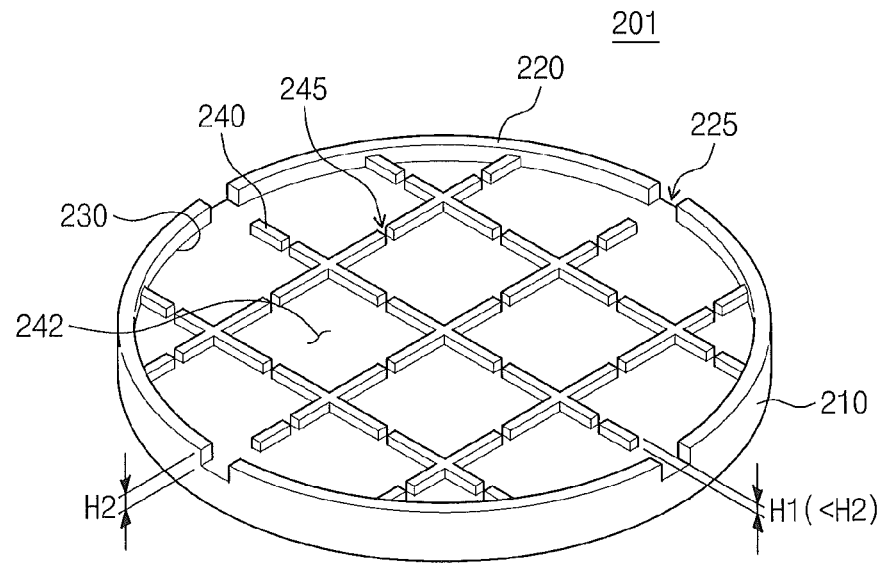

Referring to FIG. 2C, the carrier 201 may further include the inner dam 240 having the height H1 that is smaller than the height H2 of the outer dam 220. The inner dam 240 may be provided to have a grid-like or mesh-shaped pattern or structure, as described above in reference to FIG. 2B, thereby dividing the cavity 230 into a plurality of the inner regions 242. In addition, the inner dam 240 may be formed to define the inner grooves 245 provided discontinuously on the base 210. As shown in FIG. 1E, when the wafer 100 and the carrier 201 are bonded to each other, the inner dam 240 may be provided to correspond to the scribe lane of the wafer 100. In some embodiments, the inner dam 240 may have the height H1 that is smaller than that of the outer dam 220 and is too small to be in contact with the connection terminals 113. In other embodiments, the inner dam 240 may have the height H1 that is smaller than that of the outer dam 220 and is long enough to be in contact with the connection terminals 113, and in plan view, the inner dam 240 may be provided between the connection terminals 113.

Figure 2D:
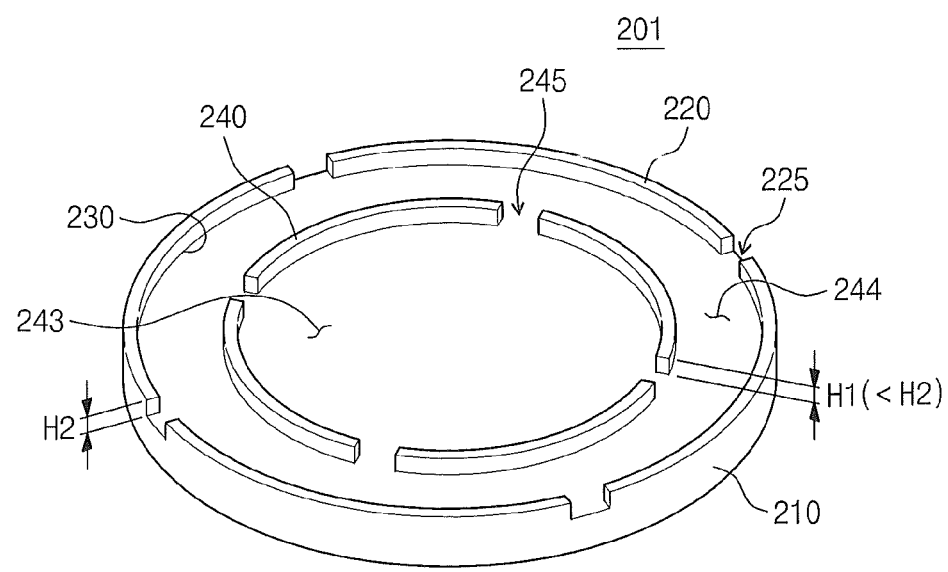

Referring to FIG. 2D, the carrier 201 may further include the inner dam 240 whose shape is similar to that of the outer dam 220. As illustrated, the inner dam 240 may be or include at least one inner wall which may be ring-shaped. Due to the presence of the inner dam 240, the cavity 230 may be divided into a circular first inner region 243 and a ring-shaped second inner region 244 surrounding the first inner region 243. The inner dam 240 may be discontinuously formed to include at least one inner gap or groove 245 connecting the first and second inner regions 243 and 244 to each other. The inner grooves 245 may be spaced apart from each other with regular or irregular spacing. The inner groove 245 may be provided at an angular position that is rotated with respect to the outer groove 225, such that the inner groove 245 may not face or align with the outer groove 225. In other embodiments, the inner groove 245 may be provided to face or align with the outer groove 225. The height H1 of the inner dam 240 may be smaller than the height H2 of the outer dam 220.

Figure 2E:
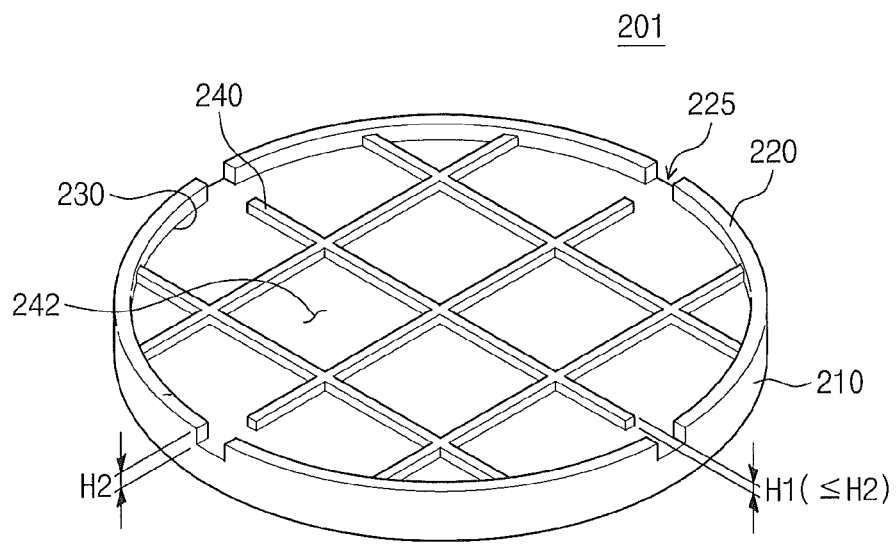

Referring to FIG. 2E, the carrier 201 may further include the inner dam 240 extending continuously and dividing the cavity 230 into a plurality of the inner regions 242. That is, the inner dam 240 may be or include a plurality of continuous inner walls that define the inner regions 242. The inner walls may form a grid-like or mesh-like shape or pattern. The height H1 of the inner dam 240 may be equivalent to or smaller than the height H2 of the outer dam 220. In some embodiments, and as illustrated, the inner dam 240 may be configured not to include the inner grooves 245 shown in FIG. 2B, and thus, the inner regions 242 may be separated from each other.

Figure 2F:
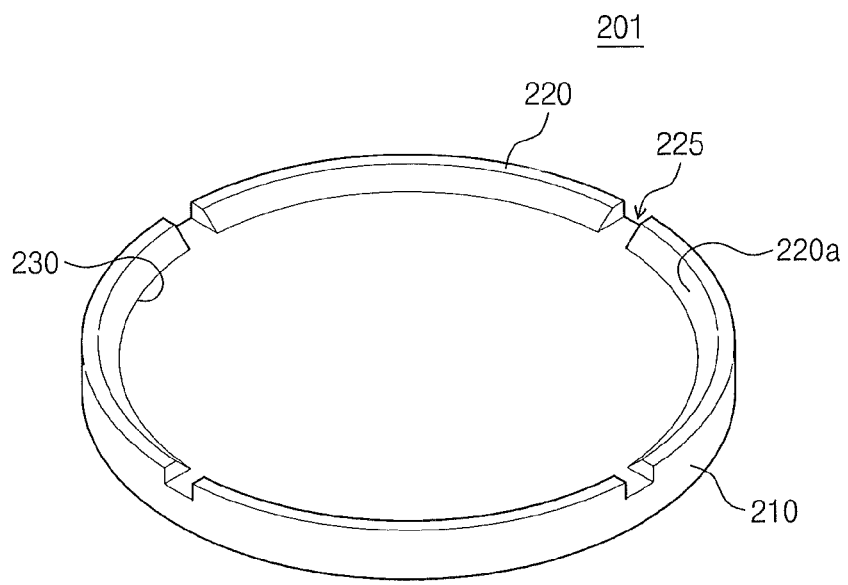

Referring to FIG. 2F, the carrier 201 may include the outer dam 220 having a slanted or sloped inner side surface 220a. For example, the inner side surface 220a of the outer dam 220 may have an uphill slope from the center of the base 210 to the edge thereof. Put another way, the inner side surface 220a and the inner surface of the cavity 230 may form an oblique angle (e.g., an obtuse angle). Each of the carriers 201 described in the present specification may be configured to include the outer dam 220 having the slanted inner side surface 220a, as shown in FIG. 2F.

Figure 2G:
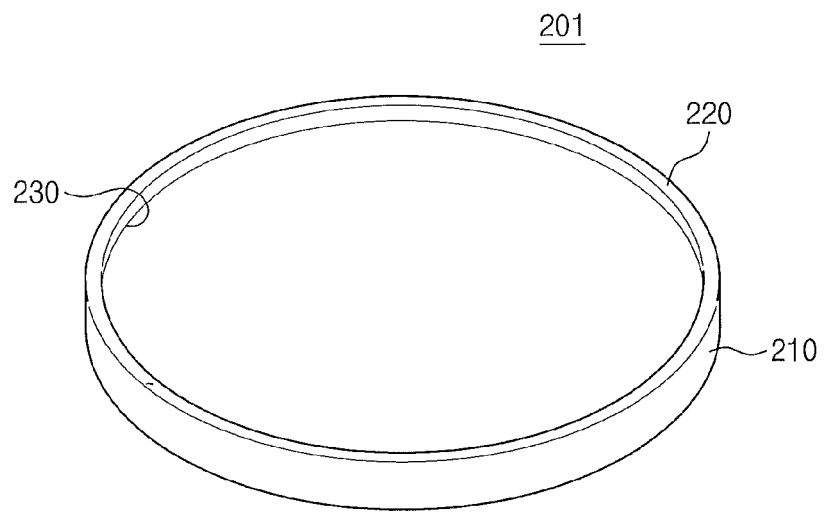

Referring to FIG. 2G, the carrier 201 may include the outer dam, wall or sidewall 220 that is continuous and extends along the edge of the base 210. That is, the outer dam 220 may be a wall without gaps or grooves. Each of the carriers 201 described in the present specification may be configured to include the continuously provided outer dam 220, as shown in FIG. 2G.

Figure 2H:
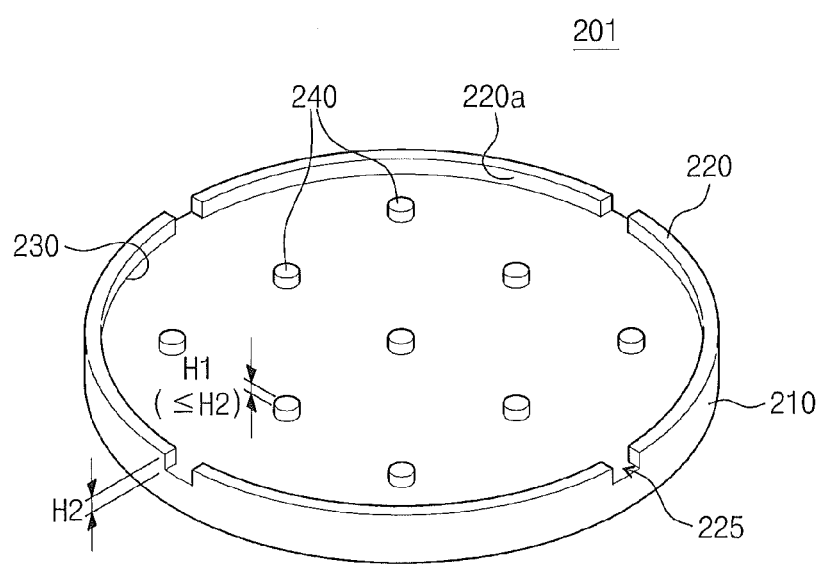

Referring to FIG. 2H, the carrier 201 may include the inner dam 240, which may be a plurality of projections shaped like an island or a point (e.g., not a line or a wall). The height H1 of the inner dam 240 may be equivalent to or smaller than the height H2 of the outer dam 220. The inner dam 240 may be regularly or irregularly arranged in the cavity 230. In plan view, the inner dam 240 may be shaped like one of circle, ellipse, cross, dash, rectangle, triangle, lozenge, and the letter "L", for example.

[Applications of Embodiments]

Figure 3A:
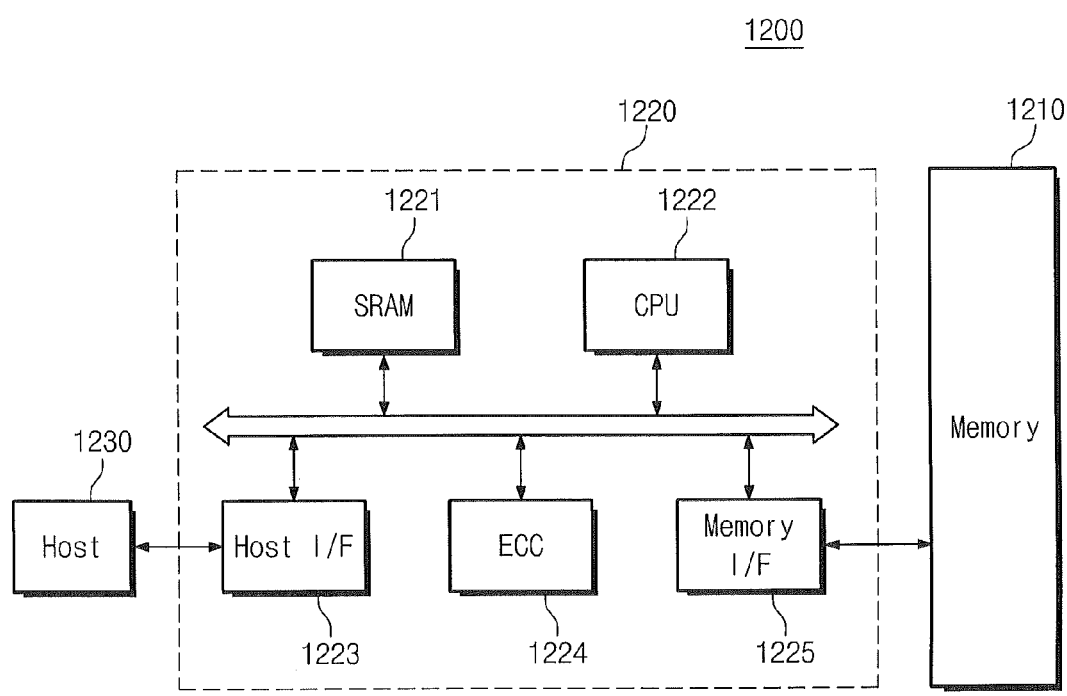
FIG. 3A is a block diagram of a memory card including a semiconductor device according to some embodiments of the inventive concept.
Figure 3B:
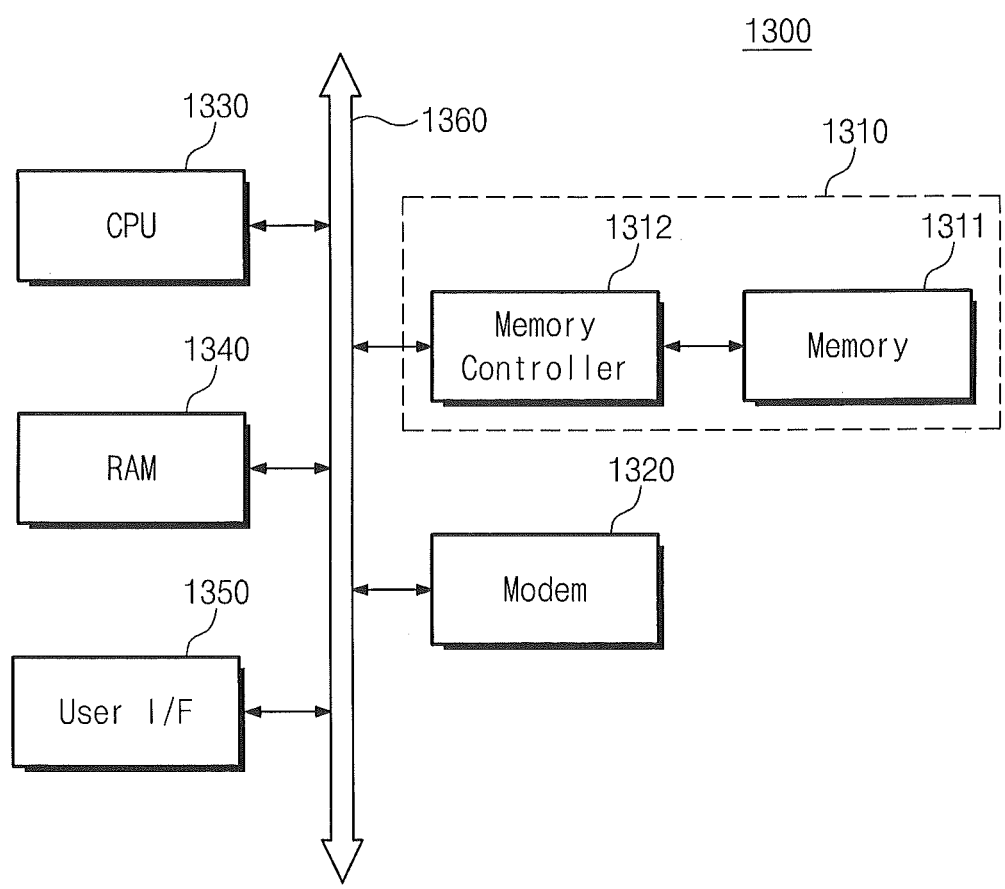
FIG. 3B is a block diagram of an information processing system including a semiconductor device according to some embodiments of the inventive concept.

FIG. 3A is a block diagram of a memory card including the semiconductor device according to example embodiments of the inventive concept. FIG. 3B is a block diagram of an information processing system including the semiconductor device according to example embodiments of the inventive concept.

Referring to FIG. 3A, a memory card 1200 may include a memory controller 1220 controlling general data exchanges between a host 1230 and a memory device 1210. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processing unit 1222 may perform general control operations for data exchange of the memory controller 1220. The memory device 1210 may include at least one of the semiconductor device 1 and the semiconductor package 2 according to example embodiments of the inventive concept.

Referring to FIG. 3B, information processing system 1300 may be realized using a memory system 1310 including at least one of the semiconductor device 1 and the semiconductor package 2 according to embodiments of the inventive concept. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 3A. Data processed by the CPU 1330 and/or input from the outside may be stored in the memory system 1310. Although not illustrated, it will be apparent to those skilled in the art that, for example, an application chipset, a camera image sensor, a camera image signal processor (ISP), an input/output device, or the like may further be included in the information processing system 1300 according to the inventive concept.

According to example embodiments of the inventive concept, the wafer carrier may include a cavity filled with the adhesive layer, such that a gap between the wafer and the wafer carrier can be removed or reduced. Accordingly, it is possible to reduce a variation in a thickness of the adhesive layer or in a space between the wafer carrier and the wafer, and thus, a failure in a wafer polishing process can be reduced and a process yield can be increased. Further, since the back lap process can be performed with improved uniformity, it is possible to prevent through silicon vias from being exposed and possibly broken or not exposed, when through silicon vias are formed through the wafer. This means that the use of the wafer carrier may contribute to an improved process yield. In the case where the adhesive layer is excessively supplied on the wafer carrier, a surplus portion of the adhesive layer can be squeezed out, such that a side surface of the wafer or the carrier is not or is substantially not polluted by the adhesive layer. Accordingly, it is possible to increase the process yield. Since the wafer carrier may be formed of various recyclable materials, it can be applied to the semiconductor process as well as several other processes and a cost of a fabrication process can be reduced.

While example embodiments of the inventive concepts have been particularly shown and described, it will be understood by one of ordinary skill in the art that variations in form and detail may be made therein without departing from the spirit and scope of the attached claims.

What is claimed is:

1. A wafer carrier comprising:
   a base;
   an outer sidewall extending along and away from an edge of the base, the outer sidewall including an upper end;
   a cavity defined by the base and the outer sidewall and configured to be filled with an adhesive layer, the cavity being provided at a center of the base; and
   at least one inner wall extending outwardly from the base, the at least one inner wall including an upper end,
   wherein the wafer carrier is configured to be bonded to a wafer with the adhesive layer in the cavity such that the outer sidewall faces and is in contact with an edge of the wafer and the cavity faces a center of the wafer,
   wherein the outer sidewall includes at least one outer groove that is formed on the edge of the base and extends to the upper end of the outer sidewall, wherein the at least one outer groove provides an open path from the cavity to outside of the wafer carrier when the wafer carrier is bonded to the wafer,
   wherein the at least one inner wall comprises a plurality of inner walls,
   wherein the plurality of inner walls comprise at least one first inner wall comprising an end that contacts the outer sidewall,
   wherein the at least one inner wall divides the cavity into a plurality of inner regions, and wherein the at least one first inner wall includes at least one inner groove that extends to an upper end of the at least one first inner wall and that provides an open path between the plurality of inner regions.

2. The wafer carrier of claim 1, wherein the at least one inner wall has a height that is substantially equivalent to a height of the outer sidewall.

3. The wafer carrier of claim 1, further comprising an insulating coating layer covering an inner surface of the cavity.

4. The wafer carrier of claim 1, wherein the outer sidewall has an inner side surface that is at an oblique angle to a top surface of the base from which the outer sidewall extends.

5. The wafer carrier of claim 1, wherein the plurality of inner walls form a grid-shaped pattern.

6. The wafer carrier of claim 5, wherein the plurality of inner walls comprises at least one second inner wall that is disposed between a pair of the outer grooves that are opposite to each other, wherein the at least one first inner wall is parallel to the second inner wall and offset from the pair of the outer grooves, and wherein an end of the second inner wall is spaced apart from the outer grooves.

7. The wafer carrier of claim 6, wherein the pair of the outer grooves comprise first and second diametrically opposed grooves, wherein the second inner wall comprises first and second opposite ends with the first end being spaced apart from the first groove and the second end being spaced apart from the second groove, and wherein the first inner wall comprises first and second opposite ends with each of the first and second ends contacting the outer sidewall.

8. The wafer carrier of claim 1, wherein the at least one inner wall has a height that is smaller than a height of the outer sidewall.

9. A wafer carrier configured to be bonded to a wafer by an adhesive layer, wherein the wafer carrier comprises:
   a base;
   an outer dam having a height and extending along an outer boundary of the base, the outer dam including at least one outer groove extending the entire height of the outer dam;
   a cavity defined by the base and the outer dam, wherein the outer dam is configured to face and contact an edge of the wafer such that the at least one outer groove provides an open path from the cavity to outside the wafer carrier when the wafer carrier is bonded to the wafer; and
   an inner dam provided in the cavity,
   wherein the inner dam comprises a plurality of inner walls,
   wherein the plurality of inner walls comprise at least one first inner wall comprising an end that contacts the outer dam,
   wherein the plurality of inner walls divide the cavity into a plurality of inner regions, and wherein the at least one first inner wall includes at least one inner groove extending an entire height of the at least one first inner wall and that provides an open path between the plurality of inner regions.

10. The wafer carrier of claim 9, wherein the inner dam has a height that is substantially equivalent to or smaller than the height of the outer dam.

11. The wafer carrier of claim 9, wherein the at least one outer groove is configured to release adhesive from the adhesive layer when the wafer carrier is bonded to the wafer.

12. A wafer carrier comprising:
   a body including a base and an outer wall having a height and extending outwardly away from an edge of the base, the base and the outer wall defining a cavity in the body, the outer wall including a plurality of gaps defined therein, a respective gap extending the entire height of the outer wall,
   wherein the wafer carrier is configured to be bonded to a wafer by an adhesive layer filling the cavity such that, when the wafer carrier is bonded to the wafer, the outer wall of the wafer carrier contacts the wafer and the gaps of the outer wall define a flow path for adhesive from the adhesive layer to flow from the cavity to outside the wafer carrier,
   wherein the body further comprises a plurality of inner walls each having a height and extending outwardly from the base and disposed in the cavity, the inner walls forming a grid-shaped pattern,
   wherein at least some of the plurality of inner walls have a gap defined therein, the gap extending the entire height of the inner wall,
   wherein the plurality of inner walls comprises at least one first inner wall comprising an end that contacts the outer wall,
   wherein the at least one first inner wall divides the cavity into a plurality of inner regions, and wherein the at least one first inner wall includes at least one gap extending the entire height of the at least one first inner wall and that provides an open flow path between the plurality of inner regions.

13. The wafer carrier of claim 12, wherein the height of each of the inner walls is substantially equal to or smaller than the height of the outer wall.

* * * * *